US007337101B1

(12) United States Patent
Perry et al.

(10) Patent No.: US 7,337,101 B1
(45) Date of Patent: Feb. 26, 2008

(54) METHOD AND APPARATUS FOR EXTENDING THE CAPABILITIES OF TOOLS USED FOR DESIGNING SYSTEMS ON PROGRAMMABLE LOGIC DEVICES TO SATISFY TIMING REQUIREMENTS

(75) Inventors: Steven Perry, High Wycombe (GB); Gregor Nixon, Bicester (GB); Ziad Abu-Lebdeh, San Jose, CA (US); Alasdair Scott, High Wycombe (GB); Philippe Marti, High Wycombe (GB)

(73) Assignee: Altera Corporation, San Jose, CA (US)

( * ) Notice: Subject to any disclaimer, the term of this patent is extended or adjusted under 35 U.S.C. 154(b) by 544 days.

(21) Appl. No.: 10/417,702

(22) Filed: Apr. 17, 2003

(51) Int. Cl.
*G06F 17/50* (2006.01)
(52) U.S. Cl. .............................. 703/14; 716/16; 703/13

(58) Field of Classification Search .................. 703/13, 703/14, 15, 19, 20, 21; 716/16
See application file for complete search history.

(56) References Cited

U.S. PATENT DOCUMENTS

| 6,195,788 | B1 * | 2/2001 | Leaver et al. ................. 716/18 |
| 6,298,319 | B1 * | 10/2001 | Heile et al. ................... 703/26 |
| 6,367,056 | B1 * | 4/2002 | Lee .............................. 716/5 |
| 6,779,169 | B1 * | 8/2004 | Singh et al. .................. 716/16 |

* cited by examiner

*Primary Examiner*—Paul Rodriguez
*Assistant Examiner*—Eunhee Kim
(74) *Attorney, Agent, or Firm*—L. Cho

(57) ABSTRACT

A method for designing a system on a programmable logic device (PLD) includes translating a timing requirement of the system into a geographical constraint. Resources on the PLD are fitted onto locations on the PLD in response to the geographical constraint.

27 Claims, 7 Drawing Sheets

METHOD AND APPARATUS FOR EXTENDING THE CAPABILITIES OF TOOLS USED FOR DESIGNING SYSTEMS ON PROGRAMMABLE LOGIC DEVICES TO SATISFY TIMING REQUIREMENTS

FIELD OF THE INVENTION

The present invention relates to the field of programmable logic devices (PLDs). More specifically, the present invention relates to a method and apparatus for extending the capabilities of tools used for designing systems on PLDs such as electronic design automation (EDA) tools to satisfy timing requirements.

BACKGROUND

PLDs may be used to implement large systems that include millions of gates and megabits of embedded memory. Of the tasks required in managing and optimizing design, placement of components onto the PLD to satisfying timing requirements of a system is often the most important and the most challenging. The complexity of large systems often requires the use of EDA tools to manage and optimize their design onto physical target devices. Automated placement algorithms in EDA tools perform the time-consuming task of managing and optimizing designs onto physical devices.

When a system has a large number of tight timing requirements standard automated placement algorithms available in off the shelf EDA tools may be incapable of finding a placement solution that satisfies all of the system's timing requirements. Many automated placement algorithms randomly place components onto the PLD. After compilation, if it is discovered that the system design fails its timing requirements, modifications to the placement of components onto the PLD may be made. Current EDA tools, however, require that placement modifications be made after a compilation process by the EDA tools and that the compilation process be run again thereafter. Compilation processes may require hours of time. In order to satisfy timing requirements, several iterations of modifications and compilation may be required before determining how components are to be grouped and where the components are placed on the target device. When multiple iterations are required to find a solution, this translates into several hours of waiting time.

Thus, what is needed is a method and apparatus for extending the capabilities of tools used for designing systems on PLDs to satisfy timing requirements. This improved method and apparatus should reduce the wait time in the compilation process.

SUMMARY

An interface is provided that allows a user to augment or substitute standard procedures used by the tools that design systems on PLDs in order to customize the tools for specific system design. A procedure that translates timing requirements into physical constraints such as geographical placement constraints may be used to extend the capabilities of the tools. The procedure allows the timing requirements to be given a higher priority in the fitting process and not be subject to the vagaries of the semi-random results achieved with simulated annealing. The procedure may reduce the number of iterations of modification and compilation that may be needed to determine how components are to be grouped and where the components are to be placed on a target device.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
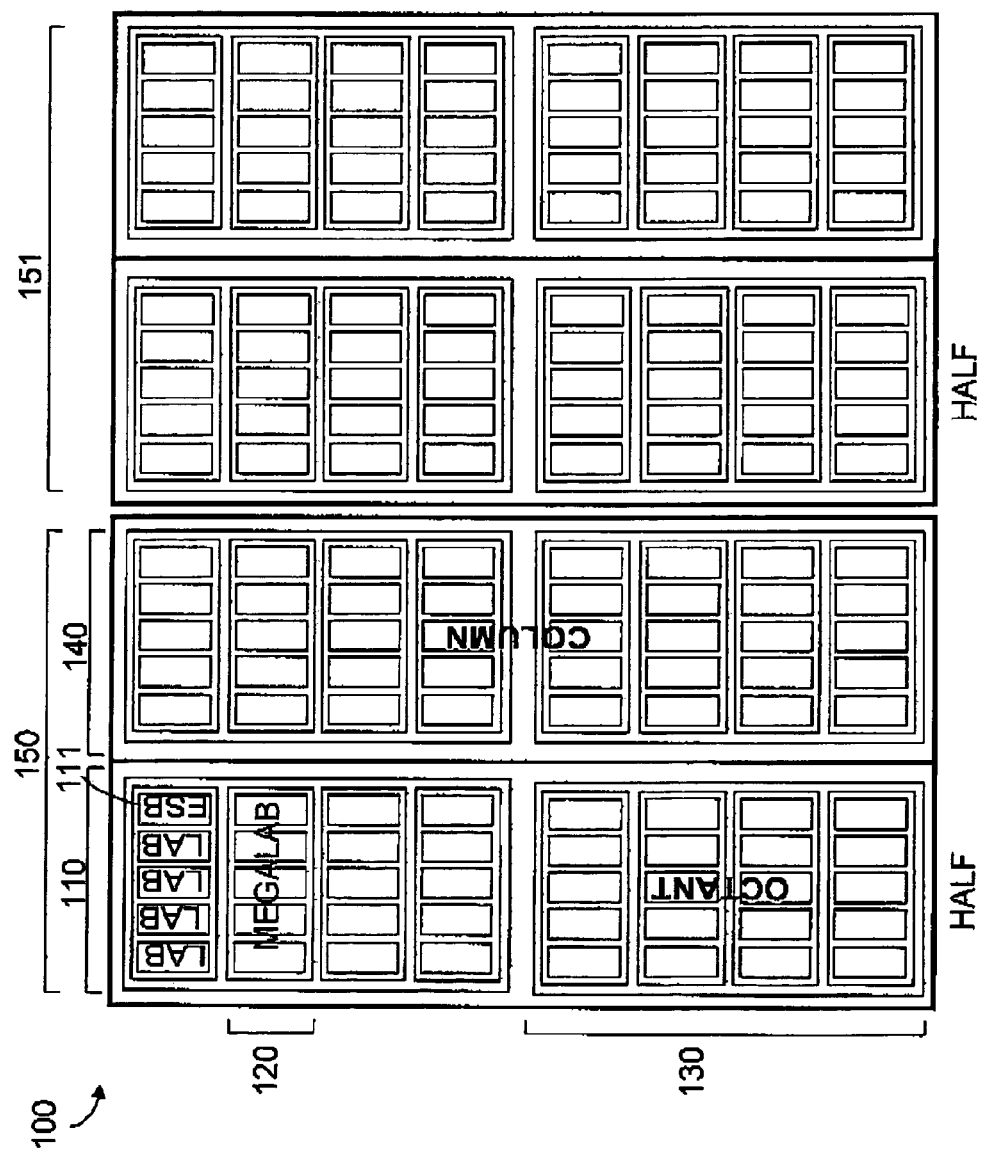
FIG. 1 illustrates a target device utilizing programmable logic devices (PLDs) according to an embodiment of the present invention.

FIG. 1 illustrates an exemplary target device 100 utilizing PLDs according to an embodiment of the present invention. The present invention may be used to design a system onto the target device 100. According to one embodiment, the target device 100 is a chip having a hierarchical structure that may take advantage of wiring locality properties of circuits formed therein. The lowest level of the hierarchy is a logic element (LE) (not shown). According to one embodiment of the target device 100, the LE may include a 4-input lookup table with a configurable flip-flop. Groups of 10 LEs form a logic-array block (LAB). A first group of LABs is shown as 110. LEs in a LAB are able to communicate with other LEs via LAB local interconnect lines (not shown).

Groups of 16 LABs and 1 embedded system block (ESB) 111 form a MegaLab. A first MegaLab is shown as 120. ESBs may be used to implement memory circuitry such as random access memories (RAMs), read only memories (ROMs), content addressable memories (CAMs), and other types of memory circuitry. Each LAB in a MegaLab is able to communicate with its adjacent neighboring LABs via the LAB local interconnect lines. Alternatively, communication may be sent via a MegaLab interconnect (not shown), which includes a set of continuous metal lines that span the width of the MegaLab. LEs within any LAB can directly drive the MegaLab interconnect. The signal then traverses the metal line to a local input line associated with the destination LAB, and then to any dependent LE.

Groups of 13 MegaLabs form an Octant. A first Octant is shown as 130. Each MegaLab in an Octant is able to communicate with other MegaLabs via a series of continuous vertical interconnect lines (V-lines) (not shown). Signals communicating across an Octant start from a source LE that directly drives a V-line. The signals traverse to the target MegaLab, switch onto the MegaLab interconnect, and make their way to the destination LE.

Two Octants are stacked vertically to form a Column. A first Column is shown as 140. Communication between Octants is made possible by a buffered switch (not shown) that connects the V-lines between two Octants together.

Groups of two Columns form a Half. A first Half is shown as 150 and a second Half is shown as 151. Continuous horizontal interconnect lines (H-lines) run across the width of the two Columns. Signals that traverse across the Half start at the source LE which can directly drive the H-line. From the H-line, the signal can drive an appropriate V-line in the target Octant and traverse its way to the destination LEs using the intra-Octant communication scheme. Two Halves are grouped side by side to form a Chip. The two Halves are connected to the buffered switch which may be used for communication between Halves.

Each level of the hierarchy described has delay characteristics. As communication is transmitted out of each level of hierarchy, a delay is incurred. As communication is transmitted to a next higher level of hierarchy, a larger delay is incurred. FIG. 1 illustrates an exemplary embodiment of a target device. It should be appreciated that a target device may include a plurality of Chips, such as target device 100 cascaded together. It should also be appreciated that the target device may include programmable logic devices arranged in a manner different than that on the target device 100. A target device may also include components other than those described in reference to the target device 100. Thus, while the invention described herein may be utilized on the architecture described in FIG. 1, it should be appreciated that it may also be utilized on different architectures, such as those employed by Altera® Corporation in its Stratix™ family of chips and those employed by Xilinx®, Inc. in its Virtex™ and Virtex™ II line of chips.

Figure 2:
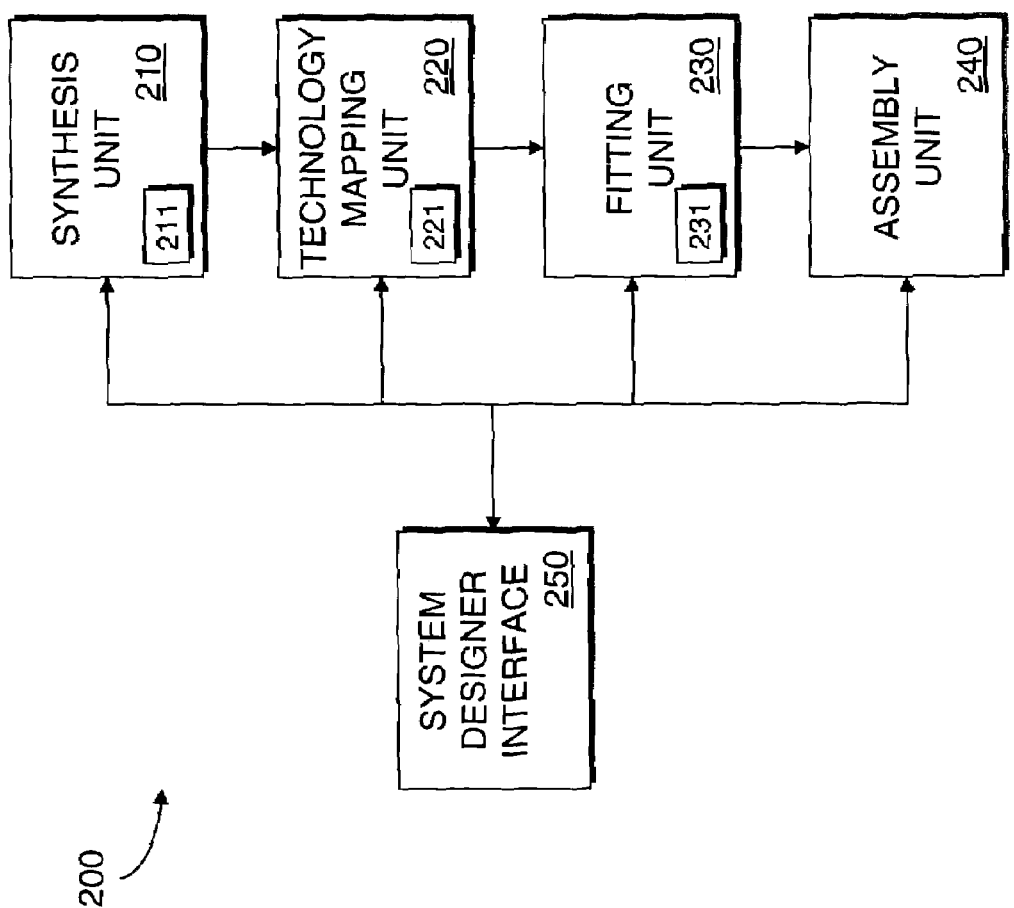
FIG. 2 illustrates a system designer according to an embodiment of the present invention.

FIG. 2 illustrates a system designer 200 according to an embodiment of the present invention. The system designer 200 may be an EDA tool. FIG. 2 illustrates software modules implementing an embodiment of the present invention. According to one embodiment, system design may be performed by a computer system (not shown) executing sequences of instructions represented by the software modules shown in FIG. 2. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software.

Block 210 represents a synthesis unit. The synthesis unit 210 generates a logic design of a system to be implemented by the target device 100 (shown in FIG. 1). According to an embodiment of the system designer 200, the synthesis unit 210 takes a conceptual Hardware Description Language (HDL) design definition and generates an optimized logical representation of the system. The optimized logical representation of the system generated by the synthesis unit 210 may include a representation that has a minimized number of logic gates and logic elements required for the system. Alternatively, the optimized logical representation of the system generated by the synthesis unit 210 may include a representation that has a reduced depth of logic and that generates a lower signal propagation delay.

Block 220 represents a technology mapping unit 220. The technology mapping unit 220 determines how to implement the logic gates and logic elements in the optimized logic representation utilizing specific resources on the target device 100. According to an embodiment of the system designer 200, the technology mapping unit 220 generates a netlist. The netlist illustrates how the resources on the target device 100 are utilized to implement the system. The netlist may, for example, represent components such as LEs on the target device 100. The netlist may also represent the interconnect lines between the components.

Block 230 represents a fitting unit 230. The fitting unit 230 fits the system on the target device 100 by determining which resources on the target device 100 to be used for specific logic gates, logic elements, and connections between the logic gates and elements. According to an embodiment of the system designer 200, the fitting unit 230 first determines how to implement portions of the optimized logic design in clusters. Clusters may represent a subset of the components on the target device 100 such as, for example, a LAB having 10 LEs. In this embodiment, after portions of the optimized logic design are implemented in clusters, the clusters may be placed by assigning the clusters to specific LABs on the target device 100. Following the placement of the clusters, routing interconnections between the LEs may be performed. The fitting unit 230 may utilize a cost function in order to determine an optimal assignment of resources on the target device 100.

Block 240 represents an assembler unit 240. The assembler unit 240 creates a data file that includes the information generated by the fitting unit 230. The data file may be a bit stream that may be used to program the target device 100. When a system design is processed by the synthesis unit 210, mapping unit 220, fitting unit 230, and assembly unit 240, this is referred to as a compilation.

Block 250 represents a system designer interface. The system designer interface 250 allows a user to interact with the modules of the system designer 200. A user may use a command supported by the system designer interface 250 to register a user-specified procedure or function that is to be executed or called back in place of or in addition to an operation performed by one of the modules of the system designer 200. The user-specified procedure may be, for example, a user-written procedure. The procedure may, for example, call script commands that utilize procedures, functions, or programs from the system designer 200 or other resources. Call-backs may be inserted by the user at strategic points available in the system designer 200. The user-specified procedures called may operate as extensions to the system designer 200. According to an embodiment of the system designer 200, the system designer interface 250 includes an script interpreter and/or library (not shown). The system designer interface 250 may, for example, utilize a Tool Command Language (TCL) interpreter and/or library. In this embodiment, the extensions may be implemented by TCL scripts. It should be appreciated, that the system designer interface 200 may implement other interpreted programming language interpreters and/or libraries and that the extensions may be implemented utilizing other scripts or programs. According to an embodiment of the system designer 200, the system designer interface 250 includes a function that registers call-backs to procedures, records script commands and a point where they should be called.

According to an embodiment of the system designer 200, the synthesis unit 210, mapping unit 220, and fitting unit 230 each includes an interface. The synthesis unit 210, mapping unit 220, and fitting unit 230 include interfaces 211, 221, and 231 respectively. Each interface registers script commands with the script interpreter in the system design interface 250. This allows the script commands to be called by a registered user-specified procedure. It should be appreciated that the synthesis unit 210, mapping unit 220, fitting unit 230, assembly unit 240, and system design interface 250 may be implemented using any known circuitry or technique. It should also be appreciated that not all the components shown in FIG. 2 may be required to implement the system designer 200.

Figure 3:
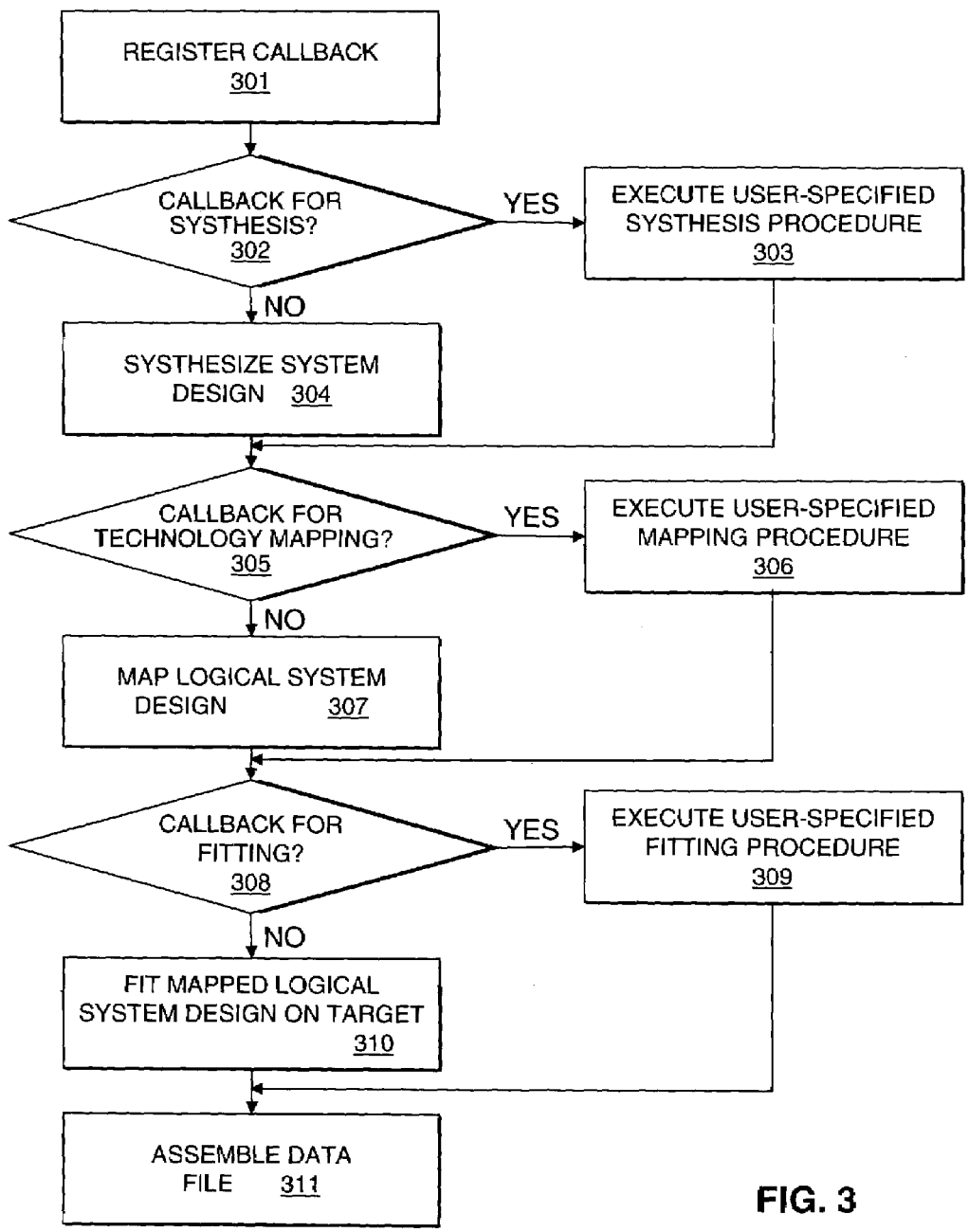
FIG. 3 is a flow chart illustrating a method for designing a system on a PLD according to an embodiment of the present invention.

FIG. 3 is a flow chart illustrating a method for designing a system on a PLD according to an embodiment of the present invention. At 301, a user is given an opportunity to register user-specified procedures to be called back or executed in a program. According to an embodiment of the present invention, the name and arguments of the user-specified procedure and the point of the program where the user-specified procedure is to be called back is recorded in a registry. In one embodiment, the user may specify any command string. This may be a call to a user written procedure that may optionally take arguments.

At 302, it is determined whether a user-specified synthesis procedure is registered for a synthesis procedure. The user-specified synthesis procedure may be registered to be executed, for example, before or after execution of the synthesis procedure has begun or in place of the synthesis procedure. According to an embodiment of the present invention, the determination of whether a user-specified synthesis procedure is registered is achieved by checking the registry. If a user-specified synthesis procedure is registered for the synthesis procedure, control proceeds to 303. If a user-specified synthesis procedure is not registered for the synthesis procedure, control proceeds to 304.

At 303, control executes the user-specified synthesis procedure. The user-specified synthesis procedure may be used to augment or replace a standard synthesis procedure of the program. Control proceeds to 305.

At 304, a synthesis procedure is performed on the system. The synthesis procedure involves generating a logic design of the system to be implemented by a target device. According to an embodiment of the present invention, the synthesis procedure generates an optimized logical representation of the system from a HDL design definition.

At 305, it is determined whether a user-specified technology mapping procedure is registered for a technology mapping procedure. The user-specified technology mapping procedure may be registered to be executed, for example, before or after execution of the technology mapping procedure has begun or in place of the technology mapping procedure. According to an embodiment of the present invention, the determination of whether a user-specified technology mapping procedure is registered is achieved by checking the registry. If a user-specified technology mapping procedure is registered for the technology mapping procedure, control proceeds to 306. If a user-specified technology mapping procedure is not registered for the technology mapping procedure, control proceeds to 307.

At 306, control executes the user-specified technology mapping procedure. The user-specified technology mapping procedure may be used to augment or replace a standard technology mapping procedure of the program. Control proceeds to 308.

At 307, a technology mapping procedure is performed on the optimized logical design of the system. The technology mapping procedure involves determining how to implement logic gates and logic elements in the optimized logic representation with specific resources on the target device. According to an embodiment of the present invention, the technology mapping procedure generates a netlist.

At 308, it is determined whether a user-specified fitting procedure is registered for a fitting procedure. The user-specified fitting procedure may be registered to be executed, for example, before or after execution of the fitting procedure has begun or in place of the fitting procedure. According to an embodiment of the present invention, the determination of whether a user-specified fitting procedure is registered is achieved by checking the registry. If a user-specified fitting procedure is registered for the fitting procedure, control proceeds to 309. If a user-specified fitting procedure is not registered for the fitting procedure, control proceeds to 310.

At 309, control executes the user-specified fitting procedure. The user-specified fitting procedure may be used to augment or replace a standard fitting procedure of the program. Control proceeds to 311.

At 310, a fitting procedure is performed on the mapped logical system design. The fitting procedure fits the system on the target device by determining which resources on the target device is to be used for specific logic gates, logic elements, and connections between the logic gates and elements. According to an embodiment of the present invention, the fitting procedure includes pre-processing, clustering, placing, and routing.

At 311, an assembly procedure is performed. The assembly procedure involves creating a data file that includes information determined by the fitting procedure. The data file may be a bit stream that may be used to program the target device.

It should be appreciated that the user-specified procedures 303, 306, and 309 may include the standard procedures 304, 307, and 310 such that the user-specified procedures 303, 306, and 309 may be executed in place of or in addition to the standard procedures 304, 307, and 310. For example, an extension in a user-specified procedure may be executed before, or after a standard procedure has begun execution.

According to an embodiment of the present invention, the system designer 200 (shown in FIG. 2) uses one instance of the interpreter in the system designer interface 250 (shown in FIG. 2). This allows a script that is run at one of the user-defined procedures (303, 306, or 309) to store data that can later be accessed by a different script that may be run later in the compilation. The system designer interface 260 (shown in FIG. 2) and the fitter unit interface 231 (shown in FIG. 2) allows the operation of the fitter unit 230 (shown in FIG. 2) to be extended by executing a script such as TCL scripts. A user may augment existing fitting algorithms, implement a specialized or domain specific algorithm, or insert late modifications by writing a script.

Figure 4:
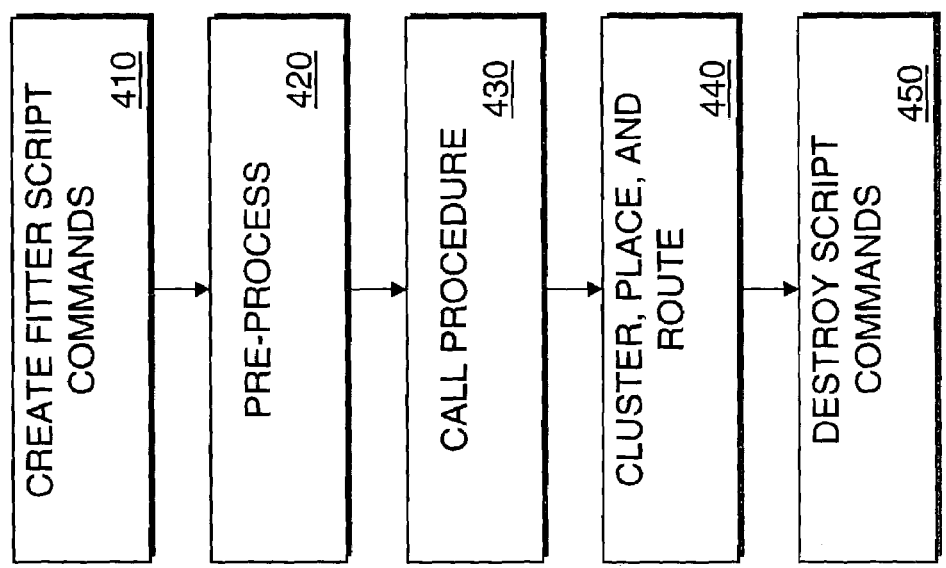
FIG. 4 is a flow chart illustrating an exemplary compilation flow where an extension is added to supplement a fitting procedure according to a first embodiment of the present invention.

FIG. 4 illustrates an exemplary compilation flow where an extension is added to supplement a fitting procedure according to a first embodiment of the present invention. In this example, a user-specified procedure is registered to be executed after pre-processing in the fitting procedure. With reference to the flow chart illustrated in FIG. 3, the registration of the user-specified procedure may be performed at 301. The compilation flow shown in FIG. 4 may be performed at 309.

Referring back to FIG. 4, at 410, fitter script commands are created. According to an embodiment of the present invention, the fitter script commands are registered with a script interpreter. When called, the script commands may execute procedures and functions supported by the system designer 200 (shown in FIG. 2) or procedures and functions supported by an external resource.

According to an embodiment of the present invention, a plurality of script commands are created prior to the execution of each user-specified procedure. In an alternate embodiment, when a user-specified procedure replaces an entire standard procedure, the plurality of script commands may be created during the execution of the user-specified procedure. These script commands may be used to access functionalities in the system designer 200 or an external source. These scripts commands that access the functionality of the system designer 200 are created regardless of whether or not the script commands are called by the user-specified procedure. In one embodiment, commands that access external resources are unknown to the system designer 200 and are created and registered with the interpreter separately.

At 420, pre-processing is performed. According to an embodiment of the present invention, preprocessing may involve placing specific LEs into LABs, matching registers with pins, or other functions.

At 430, the user-specified procedure is called.

At 440, clustering, placing, and routing of the resources on the target device 100 (as shown in FIG. 1) is performed in response to the additional constraint and/or information generated by the user-specified procedure.

At 450, the script commands registered at 410 are destroyed or unregistered.

Figure 5:
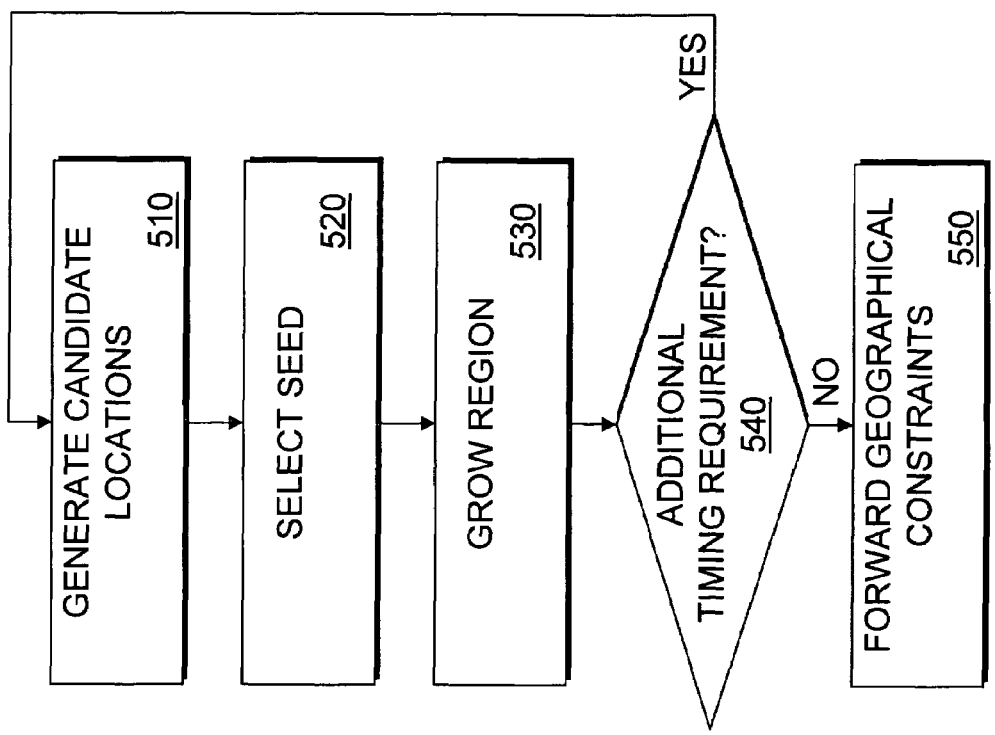
FIG. 5 is a flow chart illustrating a method for translating timing requirements into geographical fitting constraints according to an embodiment of the present invention.

FIG. 5 is a flow chart that illustrates a method for translating timing requirements of a system into geographical placement constraints according to an embodiment of the present invention. According to an embodiment of the present invention, the method may be used for translating set up time ($T_{SU}$) and hold time ($T_H$) requirements between a specified input pin and a register in the system for a Peripheral Component Interconnect (PCI) core to geographical constraints. The geographical constrains may be, for example, constraints that identify regions for placement of registers or intermediate combinatorial logic relative to specified input pins such that the timing requirements may be satisfied. It should be appreciated that this method may also be used for translating other timing requirements for other systems by identifying regions on a target device as to where components need to be placed in order to satisfy the timing requirements of the system. With reference to FIG. 4, this method may be implemented as a user-specified procedure that is executed at 430.

At 510, candidate locations to be used for placing a component are generated. The candidate locations may represent any resource available on the target device 100 such as for example a LAB, MegaLab, or Octant on the target device 100 that may be used to implement the component. The candidate locations may be generated by utilizing a technique best suited for the timing requirement of the system. According to an embodiment of the present invention, candidate locations for placing a register are determined. The candidate locations are determined to be selecting a first LAB closest to a specified input pin, a second LAB located to the left of the first LAB, a third LAB located to the right of the first LAB, a fourth LAB located next to the first LAB in a direction away from the input pin, a fifth LAB located next to the fourth LAB in a direction away from the input pin, and a sixth LAB located closest to an output pin if the component is required to feed to a register in the output pin.

Figure 6:
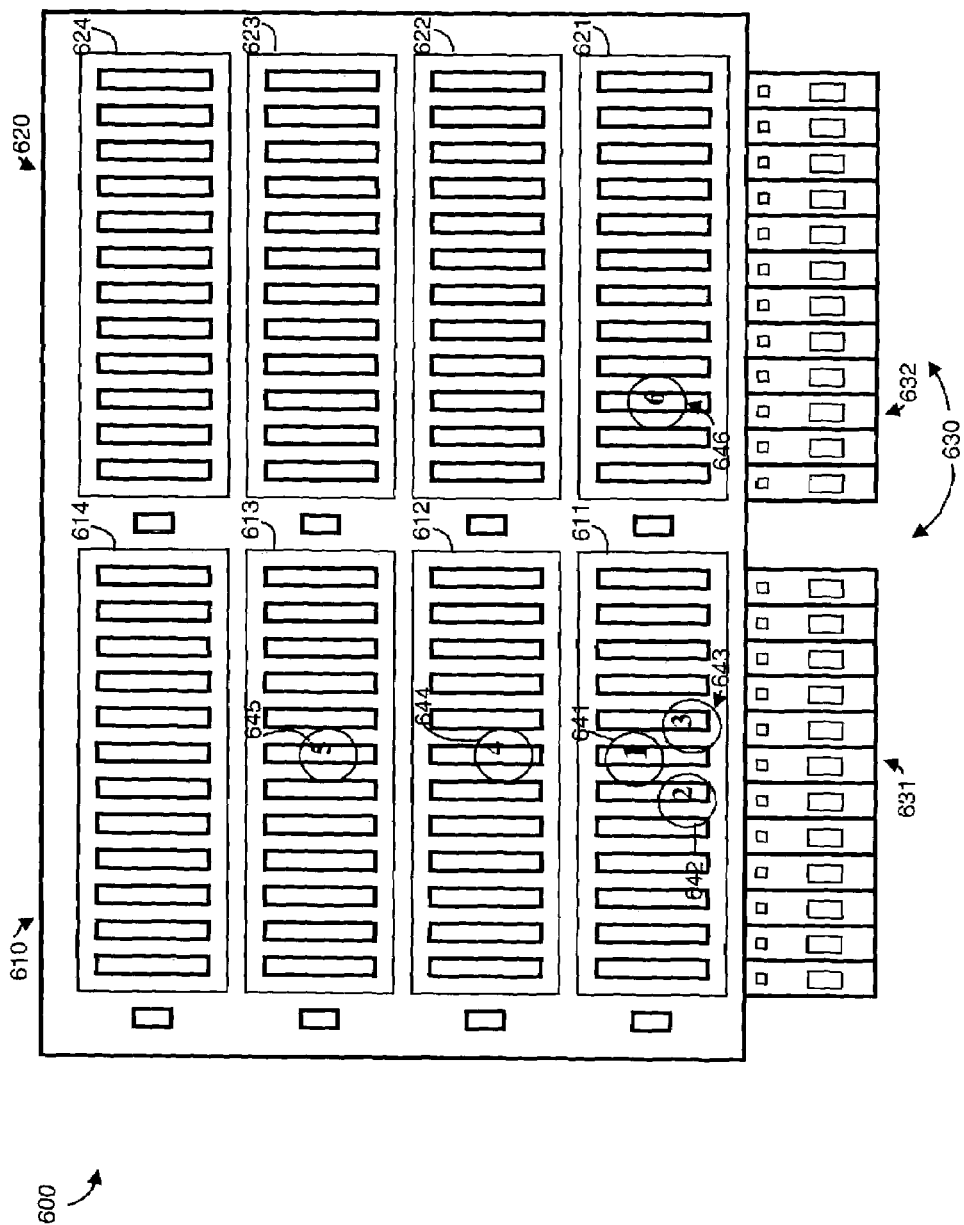
FIG. 6 illustrates how candidate locations are generated according to an embodiment of the present invention.

FIG. 6 illustrates a portion of a target device 600 with candidate locations. The portion of the target device 600 shown in FIG. 6 may be an illustration of a lower portion of the target device 100 shown in FIG. 1 with I/O pins illustrated. The portion of the target device 600 shown includes a portion of a first Octant 610 and a portion of a second Octant 620. The first and second Octants 610 and 620 include a plurality of Megalabs 611-614 and 621-624 respectively. Each of the Megalabs includes a plurality of LABs. I/O pins 630 are available to route signals onto and off of the target device 600. In this example, I/O pin 631 is designated as the input pin and I/O pin 632 is designated as an output pin. The first candidate location 641 is located on a LAB closest to the input pin 631. The second candidate location 642 is located on a LAB to the left of the first candidate location. The third candidate location 643 is located on a LAB to the right of the first candidate location. The fourth candidate location 644 is located on a LAB next to the first candidate location 641 in a direction away from the input pin 631. The fifth candidate location 645 is located on a LAB next to the fourth candidate location 644 in a direction away from the input pin 631. The sixth candidate location 646 is located on a LAB closest to the output pin 632. It should be appreciated that other techniques may be used to generate candidate locations and that other quantities of candidates may be generated.

Referring back to FIG. 5, at 520, a seed is selected from the candidate locations. According to an embodiment of the present invention, each of the candidate locations are tested to determine whether timing constraints of the system would be satisfied if the component were implemented at the candidate location. In this example, each of the candidate locations is tested in the order generated by measuring the time required to route a signal from the input pin to the register. This may be done by estimating the associated cell delay, routing delay, and programmable delay. The first candidate location tested to satisfy the timing requirements of the system is selected as the seed. If none of the candidate locations satisfy the timing requirements of the system, the candidate locations would be tested again with a different programmable delay setting. If none of the candidate locations satisfy the timing requirements with the different programmable delay settings, the first or sixth candidate location will be selected as the seed.

It should be appreciated that a candidate location may be used for placement of a register. Alternatively, a candidate location may be used for placement of another component on route to a register. Testing the candidate locations may also include determining whether a set up time for the pin is satisfied. That may depend on the propagation delay from the pin to the register, the propagation delay of the register's clock signal from its pin, and the register's own set up time and hold time.

At 530, a region for placing the component is grown from the seed. Once a seed has been selected, the region is allowed to grow. Resources of the target device 600 neighboring the seed are tested to determine whether timing requirements may be satisfied if the component is placed at the location of the resources. If timing requirements are satisfied at the location of the resource, the location may added to the region and testing continues on resources in that direction. If timing requirements cannot be satisfied at the location of a resource, no further growth of the region is made in that direction.

Figure 7:
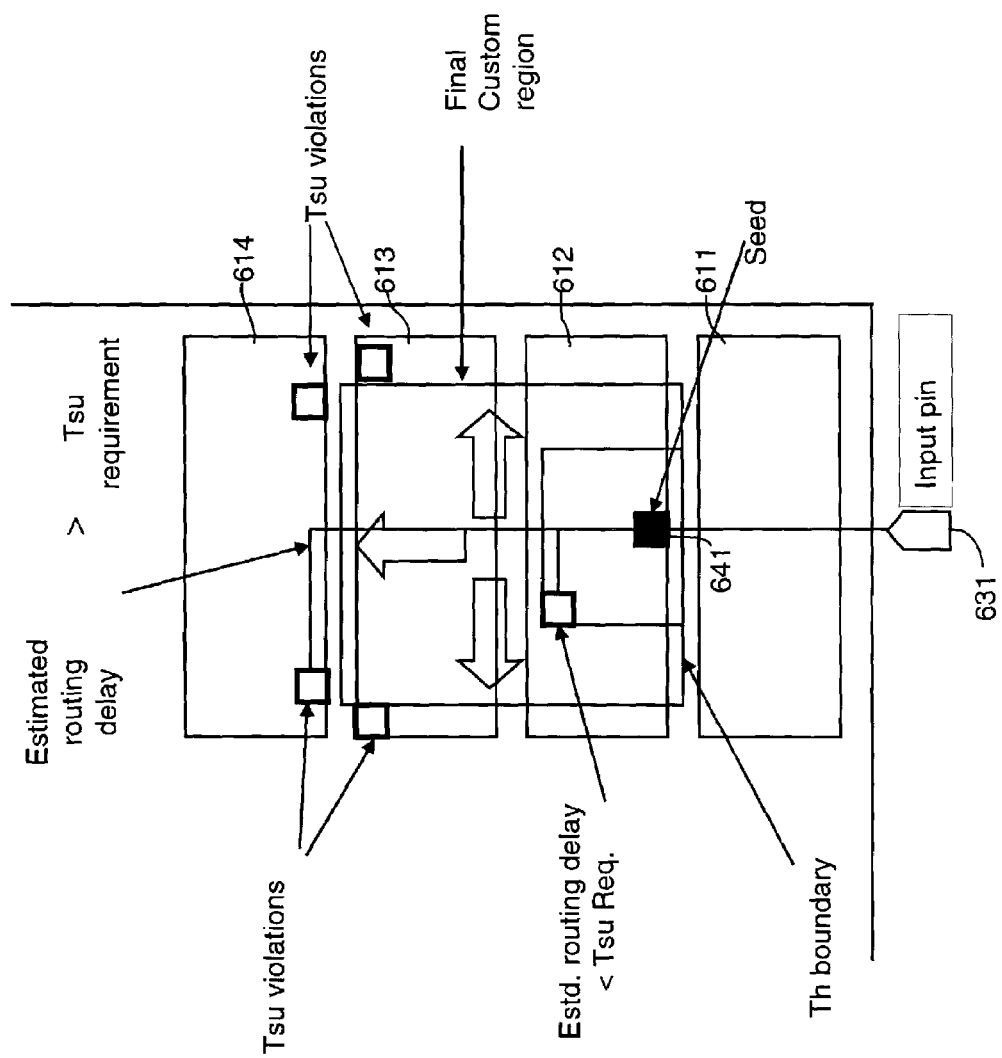
FIG. 7 illustrates how a region is grown from a seed according to an embodiment of the present invention.

FIG. 7 illustrates how a region is grown according to an embodiment of the present invention. In this example, the region is allowed to grow in three directions. The direction toward the input pin 631 is forbidden due to $T_H$ timing requirements. A growth in each direction may include a row or a column of LABs added to a current region. To grow in a direction away from the input pin 631, the LABs above the top left and top right corners of the current region will be tested against the $T_{SU}$ requirement for the associated pin. To grow in a direction to the left of the current region, the LAB to the left of the top corner of the current region will be tested against the $T_{SU}$ requirement for the associated pin. To grow in a direction to the right of the current region, the LAB to the right of the top of the current region will be tested against the $T_{SU}$ requirement for the associated pin.

Each direction of growth will be stopped when the estimated routing delay exceeds the $T_{SU}$ required. The growing procedure finishes when every growth direction is stopped.

In some instances, a register may be required to be shared and thus connected to more than one input pin. In these instances, the register may be allocated more than one region. A new region corresponding to the intersection of the assigned regions will be determined and used as the actual region assigned to the register. If the intersection is empty, the most recently determined region may be used as the actual region. According to an alternate embodiment of the present invention, the actual region may be a region created between the discrete regions or the union of the discrete regions.

Referring back to FIG. 5, at 540, it is determined whether additional timing requirements need to be addressed. In this example, determining whether additional timing requirements need to be addressed may involve determining whether additional regions need to be generated for registers corresponding to input pins. If additional timing requirements need to be addressed, control returns to 510. If additional timing requirements need not be addressed, control proceeds to 550.

At 550, the geographical constraints generated are forwarded to be processed. In an embodiment, where the procedure of translating timing requirements to geographical constraints is implemented in a user-specified procedure, the geographical constraints may be forwarded back to the standard fitting procedure. By translating timing requirements into geographical placement constraints, the present invention increases the likelihood that a design for a system that satisfies the timing requirements of the system could be generated utilizing a fewer number of runs through the compilation process. This allows valuable time and resources to be conserved.

It should be appreciated that the method described in FIG. 5 may also be implemented directly into a fitter procedure such as that illustrated in 308 of FIG. 3. In this embodiment, the fitting unit 230 of the system designer 200 shown in FIG. 2 may include additional modules to implement this method. For example, the fitting unit 230 may include a candidate location identifier (not shown) that generates candidate locations on the PLD for placement of a component in order to satisfy the timing requirement. The fitting unit 230 may include a candidate selector (not shown) that identifies one of the candidate locations as a seed. The candidate selector may operate to test the candidate locations to determine a location that meets the timing requirement. The fitter unit may include a region generator (not shown) that generates a region on the PLD from the seed.

FIGS. 3-5 are flow charts illustrating a method for designing a system on a PLD, an exemplary compilation flow where an extension is added to the system designer 200 (shown in FIG. 2), and a method for translating timing requirements into geographical placement constraints. Some of the techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention (e.g. exemplary process described below with respect to FIGS. 3-5) may be provided as a computer program product, or software, that may include a machine-readable medium having stored thereon instructions. The machine-readable medium may be used to program a computer system or other electronic device. The machine readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a programmable logic device (PLD), comprising:
   determining a region on the PLD that includes a plurality of locations for placement of a component such that a timing requirement is satisfied when the component is placed at any of the plurality of locations within the region; and
   assigning placement of the component in the region on the PLD as a geographical constraint where the component is allowed to be placed at any of the plurality of locations in the region during placement.

2. The method of claim 1, wherein determining the region on the PLD for placement of the component comprises:
   generating candidate locations on the PLD for placement of the component;
   designating one of the candidate locations that allows the component to satisfy the timing requirement as a seed; and
   growing the region from the seed where the region includes more than one location that satisfies the timing requirement.

3. The method of claim 2, wherein designating one of the candidate locations as the seed comprises testing the candidate locations to determine a location that meet the timing requirement.

4. The method of claim 3, wherein testing the candidate locations comprises comparing a time required to propagate a signal from a source location to the candidate locations with the timing requirement.

5. The method of claim 2, wherein growing the region from the seed comprises:
   testing locations next to the seed to determine whether the locations meet the timing requirement; and
   including locations that meet the timing requirement in the region.

6. The method of claim 1, wherein generating candidate locations on the PLD for placement of the component comprises:
   selecting a first location in close proximity to an input pin;
   selecting a second location to a left of the first location;
   selecting a third location to a right of the first location;
   selecting a fourth location next to the first location and at an opposite direction from the input pin;
   selecting a fifth location next to the fourth location and at the opposite direction from the input pin; and
   selecting a sixth location in close proximity to an output pin.

7. The method of claim 1, further comprising determining a second region on the PLD for placement of a second component that would allow satisfaction of a second timing requirement.

8. A method for designing a system on a programmable logic device (PLD), comprising:
   translating a timing requirement for set up time or hold time for a component of the system into a geographical constraint for the system that includes a region with a plurality of locations for placement such that the timing requirement is satisfied when the component is placed at any of the plurality of locations; and fitting the component onto one of the plurality of locations in the region to satisfy the timing requirement.

9. The method of claim 8, wherein translating the timing requirement of the system into the geographical constraint comprises determining a region on the PLD to place the component that would allow satisfaction of the timing requirement.

10. The method of claim 9, wherein determining the region on the PLD for placement of the component comprises:

generating candidate locations on the PLD for placement of the component;

designating one of the candidate locations that allows the component to satisfy the timing requirement as a seed; and growing the region from the seed where the region includes one or more locations that satisfy the timing requirement.

11. The method of claim 10, wherein designating one of the candidate locations as the seed comprises testing the candidate locations to determine a location that meets the timing requirement.

12. The method of claim 10, wherein growing the region from the seed comprises:

testing locations next to the seed to determine whether the locations meet the timing requirement; and including locations that meet the timing requirement in the region.

13. A machine-readable medium having stored thereon sequences of instructions, the sequences of instructions including instructions which, when executed by a processor, causes the processor to perform:

determining a region on a programmable logic device (PLD) for placement of a component by designating a candidate location for the component that allows a system to satisfy a timing requirement as a seed, and growing the region from the seed where the region includes a plurality of locations that allow the system to satisfy the timing requirement; and assigning placement of the component in the region on the PLD as a geographical constraint where the component is allowed to be placed at any of the plurality of locations in the region.

14. The machine-readable medium of claim 13, further comprising testing the candidate locations to determine whether the system meets the timing requirement.

15. The machine-readable medium of claim 13, wherein growing the region from the seed comprises:

testing locations next to the seed to determine whether the locations meet the timing requirement; and including locations that meet the timing requirement in the region.

16. A machine-readable medium having stored thereon sequences of instructions, the sequences of instructions including instructions which, when executed by a processor, causes the processor to perform:

translating a timing requirement for set up time or hold time for a component of a system to be implemented on a programmable logic device (PLD) into a geographical constraint for the system that includes a region with a plurality of locations or placement such that the timing requirement is satisfied when the component is placed at any of the plurality of locations; and fitting the component onto one of the plurality of locations in the region to satisfy the timing requirement.

17. The machine-readable medium of claim 16, wherein translating the timing requirement of the system into the geographical constraint comprises determining a region on the PLD to place the component that would allow satisfaction of the timing constraint.

18. The machine-readable medium of claim 17, wherein determining the region on the PLD for placement of the component comprises:

generating candidate locations on the PLD for placement of the component;

designating one of the candidate locations that allows the component to satisfy the timing requirement as a seed; and growing the region from the seed where the region includes one or more locations that satisfy the timing requirement.

19. The machine-readable medium of claim 18, wherein designating one of the candidate locations as the seed comprises testing the candidate locations to determine a location that meets the timing requirement.

20. The machine-readable medium of claim 18, wherein growing the region from the seed comprises:

testing locations next to the seed to determine whether the locations meet the timing requirement; and including locations that meet the timing requirement in the region.

21. A system designer for programmable logic devices (PLDs), comprising:

a synthesis unit that optimizing a logic design;

a technology mapping unit that maps logic circuits from the logic design onto resources available on a PLD; and a fitter unit that determines a region on the PLD that includes a plurality of locations for placement of a component such that a timing requirement is satisfied when the component is placed at any of the plurality of locations within the region, and that assigns placement of the component in the region on the PLD as a geographical constraint where the component is allowed to be placed at any of the plurality of locations.

22. The system designer of claim 21, wherein the fitter unit comprises a candidate location identifier that generates candidate locations on the PLD for placement of the component in order to satisfy the timing requirement.

23. The system designer of claim 22, wherein the fitter unit further comprises a candidate selector that identifies one of the candidate locations as a seed.

24. The system designer of claim 23, wherein the candidate selector tests the candidate locations to determine a location that meets the timing requirement.

25. The system designer of claim 23, wherein the fitter unit further comprises a region generator that generates a region on the PLD from the seed.

26. The system designer of claim 25, wherein the region generator tests locations next to the seed to determine whether the locations meet the timing requirement; and includes locations that meet the timing requirement in the region.

27. The method of claim 1, further comprising:

registering a user-specified procedure with an electronic design automation (EDA) tool, and utilizing the user-specified procedure in the EDA tool to perform the determining of the region on the PLD for placement of the component.

* * * * *